United States Patent
Han et al.

(10) Patent No.: US 8,440,531 B2
(45) Date of Patent: May 14, 2013

(54) METHODS OF FORMING SEMICONDUCTOR MEMORY DEVICES HAVING VERTICALLY STACKED MEMORY CELLS THEREIN

(75) Inventors: Tae-Jong Han, Jeonju-si Jeonbuk (KR); Daewoong Kim, Hwaseong-si (KR); Kyung-Tae Jang, Seoul (KR); Bongcheol Kim, Seoul (KR); Ohchel Kwon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/448,582

(22) Filed: Apr. 17, 2012

(65) Prior Publication Data

US 2012/0276719 A1 Nov. 1, 2012

(30) Foreign Application Priority Data

Apr. 29, 2011 (KR) .................. 10-2011-0041112

(51) Int. Cl.
*H01L 21/336* (2006.01)
(52) U.S. Cl.
USPC ............ 438/288; 438/591; 257/E21.21
(58) Field of Classification Search ............ 438/288, 438/591; 257/E21.21
See application file for complete search history.

(56) References Cited

U.S. PATENT DOCUMENTS

| 7,982,261 B2 | 7/2011 | Kidoh et al. |
| 2009/0224309 A1 | 9/2009 | Kidoh et al. |
| 2010/0181610 A1* | 7/2010 | Kim et al. ............ 257/314 |
| 2010/0207195 A1 | 8/2010 | Fukuzumi et al. |
| 2011/0287612 A1* | 11/2011 | Lee et al. ............ 438/478 |
| 2011/0298037 A1* | 12/2011 | Choe et al. ............ 257/324 |
| 2012/0092926 A1* | 4/2012 | Whang et al. ......... 365/185.01 |

FOREIGN PATENT DOCUMENTS

| JP | 2009-146954 | 7/2009 |
| JP | 2009-212280 A | 9/2009 |
| JP | 2010-114204 A | 5/2010 |
| KR | 10-2010-0050421 A | 5/2010 |
| KR | 10-2010-0087743 A | 8/2010 |

* cited by examiner

*Primary Examiner* — Trung Q Dang
(74) *Attorney, Agent, or Firm* — Myers Bigel Sibley & Sajovec, P.A.

(57) ABSTRACT

Methods of forming vertical nonvolatile memory devices utilize carbon-blocking sacrificial capping layers to increase device yield by reducing the likelihood that one or more vertically-stacked layers of materials will lift-off during fabrication. These capping layers may be provided to cover carbon-containing sacrificial layers that are highly polymerized.

20 Claims, 22 Drawing Sheets

METHODS OF FORMING SEMICONDUCTOR MEMORY DEVICES HAVING VERTICALLY STACKED MEMORY CELLS THEREIN

REFERENCE TO PRIORITY APPLICATION

This U.S. non-provisional patent application claims priority under 35 U.S.C. §119 to Korean Patent Application No. 10-2011-0041112, filed Apr. 29, 2011, the disclosure of which is hereby incorporated herein by reference.

FIELD

The present invention relates to integrated circuit memory devices and methods of forming same and, more particularly, to nonvolatile memory devices and methods of forming nonvolatile memory devices.

BACKGROUND

Integrated semiconductor memory devices have been increasingly demanded to have larger capacity, operate at reduced power levels and be more readily fabricated with reduced production costs. In planar semiconductor memory devices, the integration density may be mainly determined by a planar area that a unit memory cell occupies. Thus, various process technologies for forming fine patterns have been continuously developed to increase the integration density of planar semiconductor memory devices. However, there may be some limitations in developing the process technologies for forming fine patterns. For example, high cost equipment or apparatus may be required to form the fine patterns. In addition, it may be difficult to realize the fine patterns even with the high cost equipments or apparatus.

More recently, semiconductor memory devices including memory cells arrayed in a vertical direction have been proposed to increase the integration density thereof. Nevertheless, new processes which are capable of reducing the bit cost and realizing reliable products are still required for successful mass production of the semiconductor memory devices including memory cells arrayed in a vertical direction.

SUMMARY

Methods of forming vertical nonvolatile memory devices according to embodiments of the invention include forming a first vertical stack of layers on a substrate. This first vertical stack of layers includes a composite of at least a plurality of first material layers and a plurality of second material layers arranged as an alternating stack of first and second material layers containing different materials. For example, the first material layers may be dielectric materials such as silicon dioxide and the second material layers may be formed of materials such as silicon nitride, silicon oxynitride and silicon carbide. A first opening is then formed, which extends through at least a plurality of the first material layers and at least a plurality of the second material layers within the first vertical stack of layers. At least a portion of the first opening is filled with a composite stack of a bulk sacrificial pattern and a capping sacrificial pattern on the bulk sacrificial pattern. The bulk and capping sacrificial patterns are formed of different materials and the bulk sacrificial pattern includes a polymerized material containing carbon. To provide higher levels of vertical memory cell integration, a second vertical stack of layers of different materials is formed on the first vertical stack of layers. A second opening is then formed, which extends through the second vertical stack of layers and exposes the capping sacrificial pattern within the first opening. The capping sacrificial pattern and the bulk sacrificial pattern are then removed through the second opening.

According to some embodiments of the invention, the capping sacrificial pattern includes a material that blocks diffusion of carbon therein (e.g., carbon out-diffusion from the bulk sacrificial pattern). The steps of forming a second opening and removing the capping sacrificial pattern may be performed within a single reaction chamber. In addition, the step of removing the bulk sacrificial pattern through the second opening may include exposing the bulk sacrificial pattern to a reaction gas containing oxygen. In particular, the step of removing the bulk sacrificial pattern through the second opening may include anisotropically dry etching the bulk sacrificial pattern using a reaction gas containing oxygen.

According to additional embodiments of the invention, the step of forming a bulk sacrificial pattern in the first opening may include depositing the bulk sacrificial pattern into the first opening using a spin-on coating process. This deposition of the bulk sacrificial pattern may be followed by etching the deposited bulk sacrificial pattern for a sufficient duration to recess the bulk sacrificial pattern within the first opening. Thereafter, the capping sacrificial pattern is deposited into a recess within the first opening and then planarized for a sufficient duration to expose an upper surface of the first vertical stack of layers.

According to still further embodiments of the invention, the step of removing the capping sacrificial pattern and the bulk sacrificial pattern through the second opening is followed by lining sidewalls of the first and second openings with a semiconductor active pattern. Steps are also performed to selectively etch the second vertical stack of layers and the first vertical stack of layers in sequence to define a groove therein that exposes the substrate. The plurality of second material layers are then replaced with gate patterns of nonvolatile memory cell transistors.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
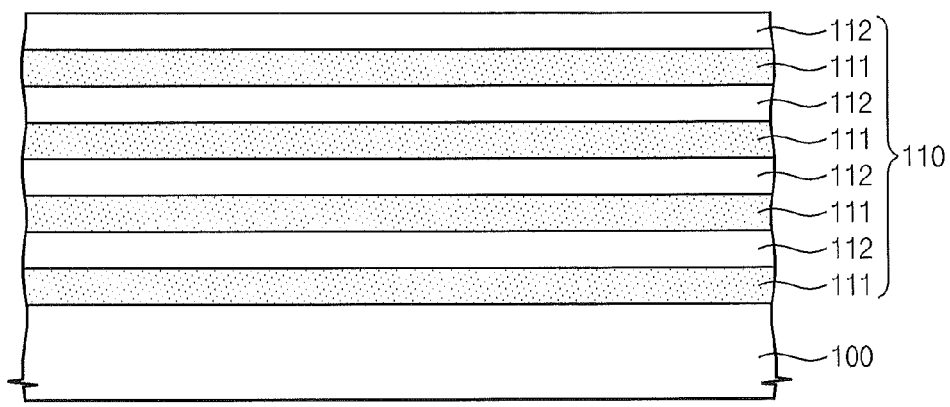
FIGS. 1 to 12 are cross sectional views illustrating a method of forming a semiconductor memory device according to an embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various different forms. Rather, these embodiments are provided so that this disclosure will be thorough and complete, and will fully convey the scope of the invention to those skilled in the art.

The terminology used herein is for the purpose of describing particular embodiments only and is not intended to limit the invention. As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Similarly, it will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

Exemplary embodiments of the inventive concept will be described with reference to cross sectional views, perspective views and/or schematic block diagrams as ideal exemplary views of the inventive concept. In the drawings, embodiments of the inventive concept are not limited to the specific examples provided herein and are exaggerated for clarity. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Methods of forming semiconductor memory devices according to embodiments of the inventive concept will now be described more fully hereinafter. FIGS. 1 to 12 are cross sectional views illustrating a method of forming a semiconductor memory device according to an embodiment of the inventive concept.

Referring to FIG. 1, a first stack structure 110 is formed on a substrate 100. The substrate 100 may be formed of a semiconductor material. For example, the substrate 100 may include a silicon substrate, a silicon-germanium substrate or a germanium substrate. Although not shown in the drawings, a buffer insulation layer may be formed between the substrate 100 and the first stack structure 110. The buffer insulation layer (not shown) may be formed using a thermal oxidation process or a chemical vapor deposition (CVD) process. In an embodiment, the buffer insulation layer (not shown) may include a silicon oxide material.

The first stack structure 110 may be formed by alternately and repeatedly stacking a plurality of first material layers 111 and a plurality of first dielectric layers 112 on the substrate 100. In an embodiment, the first material layers 111 may be formed of a material layer having an etch selectivity with respect to the first dielectric layers 112. For example, when the first dielectric layers 112 include a silicon oxide layer, the first material layers 111 may include at least one of a silicon nitride layer, a silicon oxynitride layer, a silicon carbide layer and a silicon layer. However, the first material layers 111 and the first dielectric layers 112 may not be limited to the aforementioned material layers. In an embodiment, the first material layers 111 may be formed to have a same thickness. Alternatively, the lowermost first material layer 111 of the first material layers 111 may be formed to be thicker than the other first material layers 111.

Figure 2:
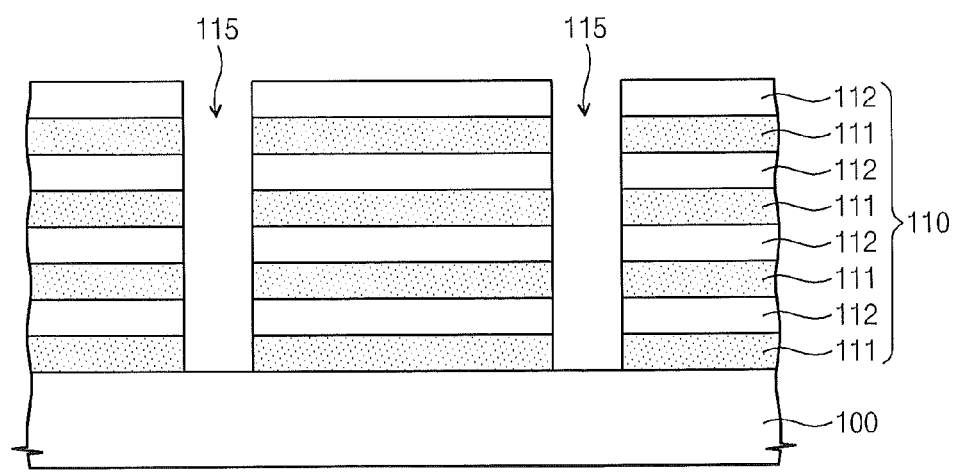

Referring to FIG. 2, the first stack structure 110 may be patterned to form first openings 115 penetrating the first stack structure 110. The first openings 115 may expose portions of the substrate 100. In an embodiment, each of the first openings 115 may be formed to have a tapered shape that is narrower at the bottoms of the openings relative to the tops of the openings.

Figure 3:
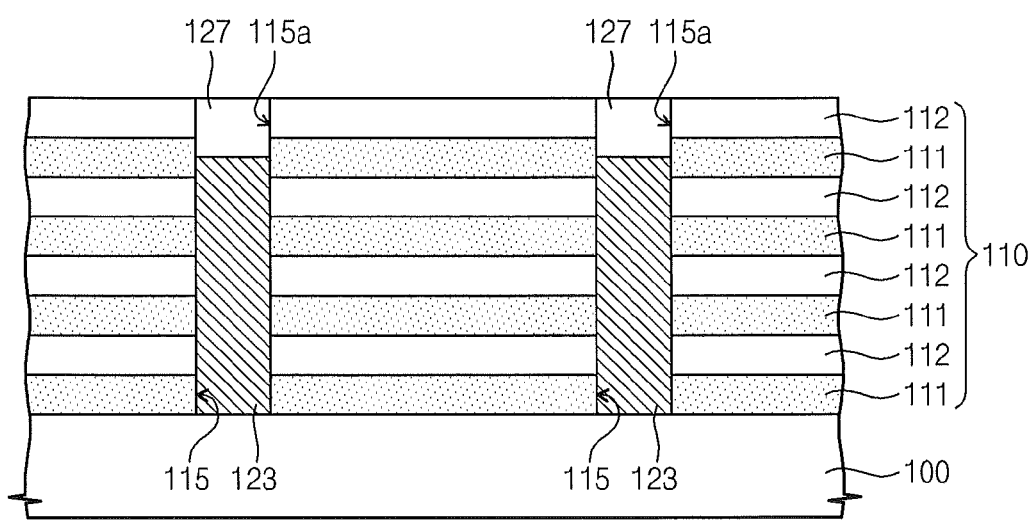

Referring to FIG. 3, bulk sacrificial patterns 123 may be formed in the first openings 115, respectively. The bulk sacrificial patterns 123 may be formed by depositing a bulk sacrificial layer filling the first openings 115 on the first stack structure 110 and by etching back a certain portion of the bulk sacrificial layer. Etching the certain portion of the bulk sacrificial layer may be performed using an etch-back process of various dry etching processes. In an embodiment, the etch-back process may be performed using a reaction gas including an oxygen gas and an argon gas. Etching the certain portion of the bulk sacrificial layer may be performed until top surfaces of the bulk sacrificial patterns 123 become lower than a top surface of the first stack structure 110. That is, recessed regions 115a may be formed on the bulk sacrificial patterns 123, and each of the recessed regions 115a may be defined by a top surface of each bulk sacrificial pattern 123 and upper sidewalls of the first openings 115.

The bulk sacrificial layer may include a highly polymerized compound material containing carbon. In an embodiment, the bulk sacrificial layer may be formed using a spin coating process. For example, the bulk sacrificial layer may be formed of a spin-on-hard mask (SOH) layer. Capping sacrificial patterns 127 may be formed in the first openings 115 on the bulk sacrificial patterns 123, respectively. That is, the capping sacrificial patterns 127 may be formed in the recessed regions 115a. In an embodiment, top surfaces of the capping sacrificial patterns 127 may be coplanar with the top surface of the first stack structure 110. The capping sacrificial patterns 127 may be formed by depositing a capping sacrificial layer filling the recessed regions 115a on the first stack structure 110 and then planarizing the capping sacrificial layer until the top surface of the first stack structure 110 is exposed. In an embodiment, the capping sacrificial patterns 127 may include the same material as the first dielectric layers 112. For example, in the event the first dielectric layers 112 include a silicon oxide material, the capping sacrificial patterns 127 may also include a silicon oxide material. Alternatively, the capping sacrificial patterns 127 may be formed of a material having an etch selectivity with respect to the first material layers 111 and the first dielectric layers 112. For example, in the event the first dielectric layers 112 include a silicon oxide material and the first material layers 111 include a silicon nitride material, the capping sacrificial patterns 127 may include a polysilicon material. However, the capping sacrificial patterns 127 are not limited to the materials described above.

The carbon in the bulk sacrificial patterns 123 may be vaporized and out-diffused during a subsequent high temperature process. The vaporization and the out-diffusion of the carbon may cause a certain material layer to be formed on the first stack structure 110 to lift off. However, according to the embodiments of the invention, the lift of the certain material layer may be suppressed because of the presence of the capping sacrificial patterns 127, which block out-diffusion of carbon from the bulk sacrificial patterns 123.

Figure 4:
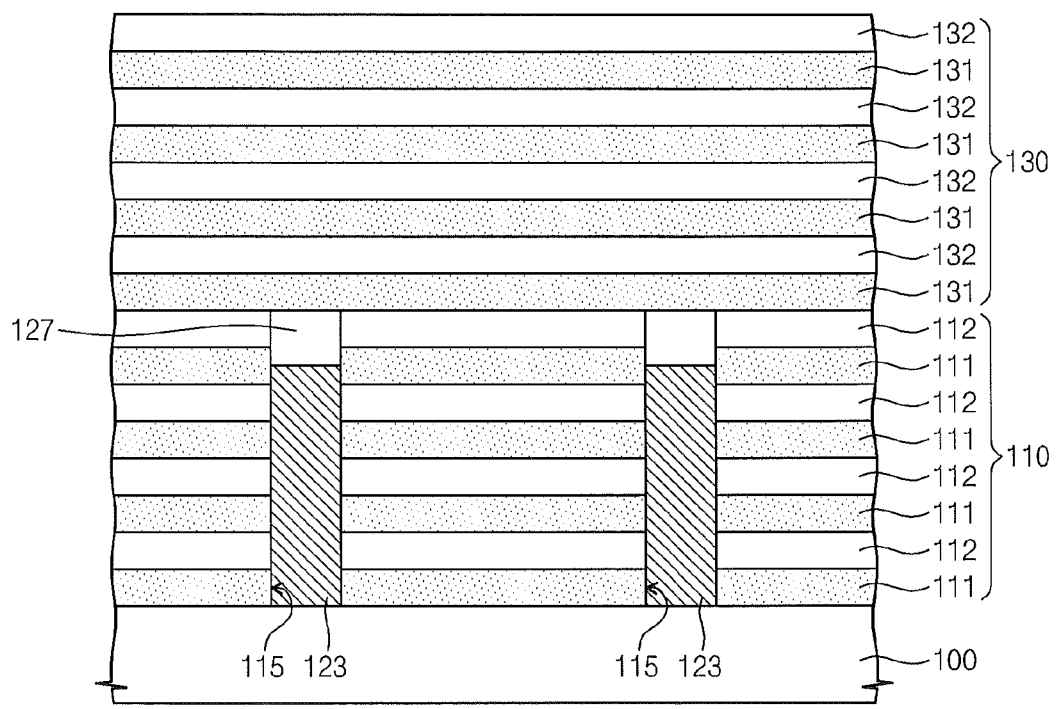

Referring to FIG. 4, a second stack structure 130 may be formed on the first stack structure 110. The second stack structure 130 may be formed by alternately and repeatedly stacking a plurality of second material layers 131 and a plurality of second dielectric layers 132. In an embodiment, the second material layers 131 may be formed to have a same thickness. Alternatively, the uppermost second material layer 131 of the second material layers 131 may be formed to be thicker than the other second material layers 131.

The second material layers 131 may be formed of a material having an etch selectivity with respect to the second dielectric layers 132. For example, in the event the second dielectric layers 132 include a silicon oxide layer, the second material layers 131 may be formed of at least one of a silicon nitride layer, a silicon oxynitride layer, a silicon carbide layer and a silicon layer. However, the second material layers 131 and the second dielectric layers 132 may not be limited to the aforementioned material layers. In an embodiment, the second material layers 131 may be formed of the same material layer as the first material layers 111, and the second dielectric layers 132 may be formed of the same material layer as the first dielectric layers 131.

Figure 5:
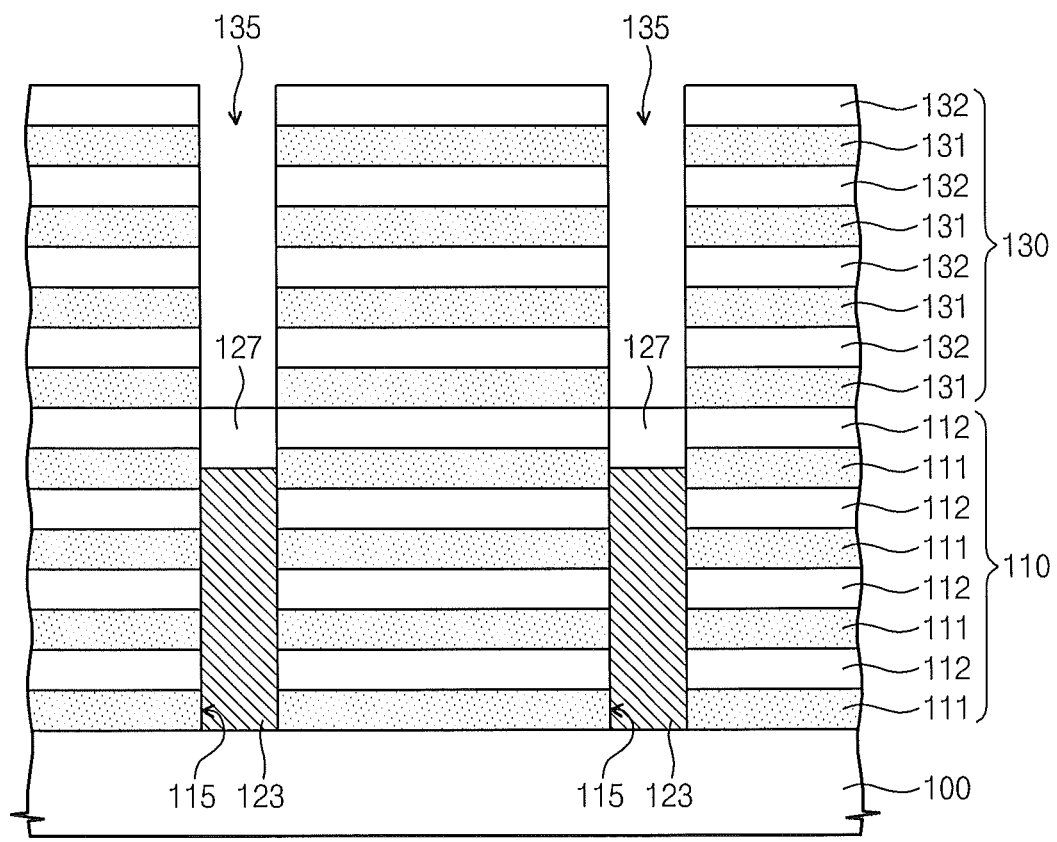

Referring to FIG. 5, the second stack structure 130 may be patterned to form second openings 135 penetrating the second stack structure 130. The second openings 135 may be formed to at least partially overlap with the first openings 115, respectively. Thus, second openings 135 may expose the capping sacrificial patterns 127, respectively. That is, the second openings 135 may be located over and aligned to the first openings 115. In an embodiment, the second openings 135 may completely overlap with the first openings 115 in a plan view. Forming the second openings 135 may include forming a mask pattern (not shown) on the second stack structure 130 and etching the second stack structure 130 using the mask pattern as an etch mask. In an embodiment, etching the second stack structure 130 may be performed using a dry etching process. In an embodiment, each of the second openings 135 may be formed to have a tapered shape so that the second openings 135 are narrower at their bottoms relative to their tops.

Figure 6:
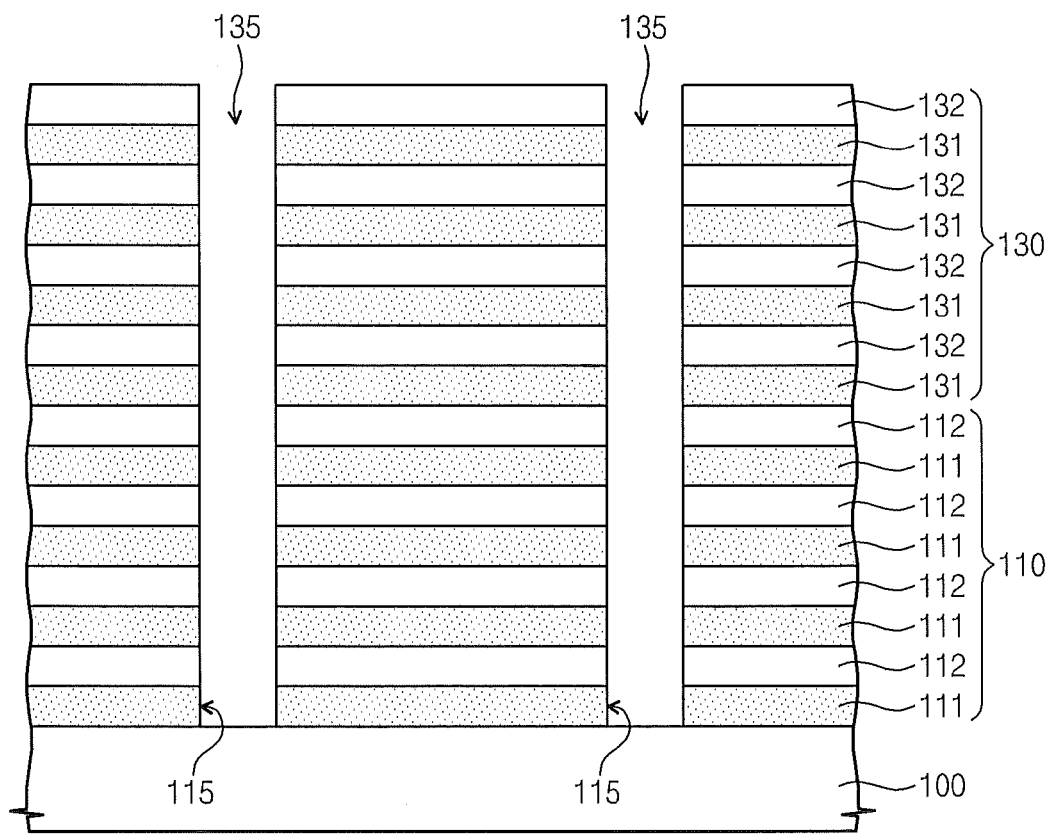

Referring to FIG. 6, the capping sacrificial patterns 127 and the bulk sacrificial patterns 123 may be removed. The capping sacrificial patterns 127 may be removed using an anisotropic dry etching process. During the dry etching process for removing the capping sacrificial patterns 127, an etch rate of the capping sacrificial patterns 127 may be higher than etch rates of the first and second material layers 111 and 131 and the first and second dielectric layers 112 and 132. The etching process for forming the second openings 135 and the etching process for removing the capping sacrificial patterns 127 may be performed in a same reaction chamber. That is, the etching process for forming the second openings 135 and the etching process for removing the capping sacrificial patterns 127 may be performed in a single reaction chamber. Consequently, top surfaces of the bulk sacrificial patterns 123 may be exposed.

The bulk sacrificial patterns 123 may be then removed using a dry etching process. The dry etching process for removing the bulk sacrificial patterns 123 may be performed using a reaction gas including oxygen since the bulk sacrificial patterns 123 includes a highly polymerized compound material containing carbon. The first and second material layers 111 and 131, the first and second dielectric layers 112 and 132, and the substrate 100 may have a high etch resistant property in the reaction gas for removing the bulk sacrificial patterns 123. That is, the first and second material layers 111 and 131, the first and second dielectric layers 112 and 132, and the substrate 100 may be hardly etched during the dry etching process for removing the bulk sacrificial patterns 123. Thus, while the bulk sacrificial patterns 123 are removed using the dry etching process, etching damage to the first and second material layers 111 and 131, the first and second dielectric layers 112 and 132 and the substrate 100 may be minimized. Based on this sequence of etching steps, the capping sacrificial patterns 127 and the bulk sacrificial patterns 123 will be removed to empty the first openings 115. Thus, the first openings 115 and the second openings 135 may be spatially connected to each other to thereby define a plurality of through openings. Each of the through openings may penetrate the first and second stack structures 110 and 130.

Figure 7:
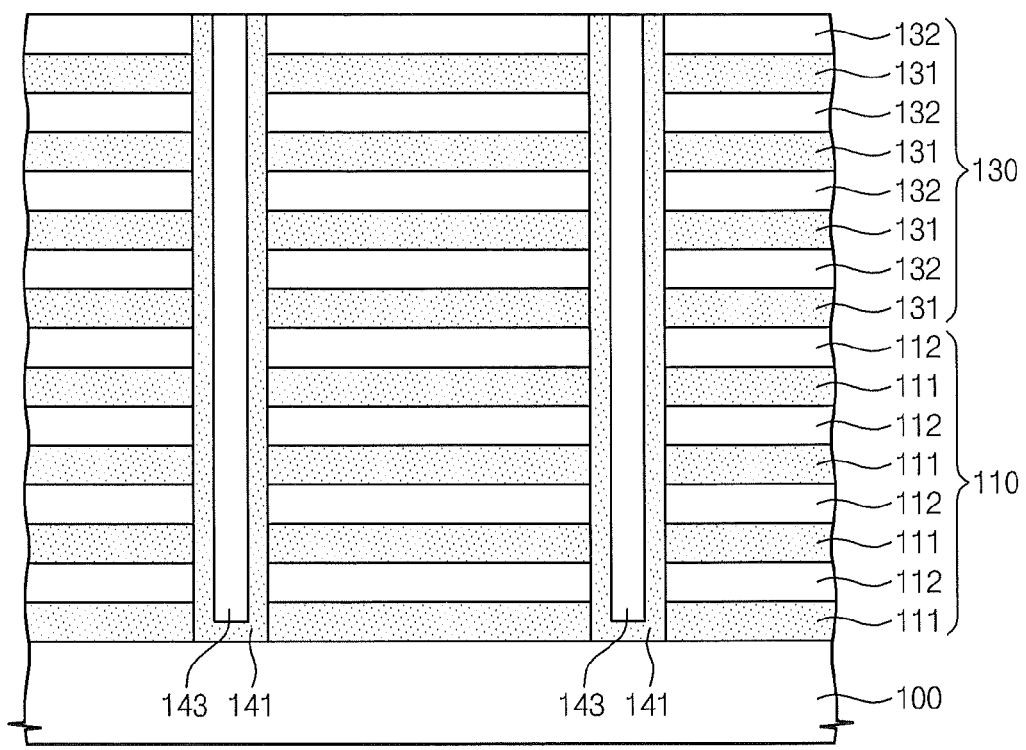

Referring to FIG. 7, an active pattern 141 and a buried dielectric pattern 143 may be formed in each through opening defined by the first opening 115 and the second opening 135. That is, a plurality of active patterns 141 may be respectively formed in the through openings, and a plurality of buried dielectric patterns 143 may also be respectively formed in the through openings. The active patterns 141 and the buried dielectric patterns 143 may be formed by conformably depositing a semiconductor layer on the substrate including the through openings and then forming a buried dielectric layer filling the through openings on the semiconductor layer. The deposited buried dielectric layer and deposited semiconductor layer are then planarized to expose a top surface of the second stack structure 130. In an embodiment, the planarization process of the buried dielectric layer and the semiconductor layer may be performed so that the active patterns 141 and the buried dielectric patterns 143 are recessed. That is, top surfaces of the active patterns 141 and the buried dielectric patterns 143 may be located at a lower level than the top surface of the second stack structure 130.

The active patterns 141 may be formed to conformably cover portions of the top surface of the substrate 100 exposed by the through openings and sidewalls of the through openings. In an embodiment, each of the active patterns 141 may be formed to have a cylindrical shape with a U-shaped cross sectional view, as illustrated. However, the shape of the active patterns 141 is not limited to a cylindrical shape. That is, the active patterns 141 may be embodied to have various forms other than the cylindrical shape. The active patterns 141 may be formed of any one of semiconductor materials. For example, the active patterns 141 may be formed of a silicon material, and the silicon material may have a polycrystalline structure. However, the material of the active patterns 141 is not limited to silicon material. That is, the active patterns 141 may be formed of another material which is different from the aforementioned material. Further, the active patterns 141 may have another crystalline structure which is different from the aforementioned polycrystalline structure.

The buried dielectric patterns 143 may be surrounded by the active patterns 141, respectively. That is, a bottom surface and a sidewall of each buried dielectric pattern 143 may be surrounded by one of the active patterns 141. The buried dielectric patterns 143 may include a dielectric material. For example, the buried dielectric patterns 143 may include at least one of a silicon oxide material, a silicon nitride material and a silicon oxynitride material.

Figure 8:
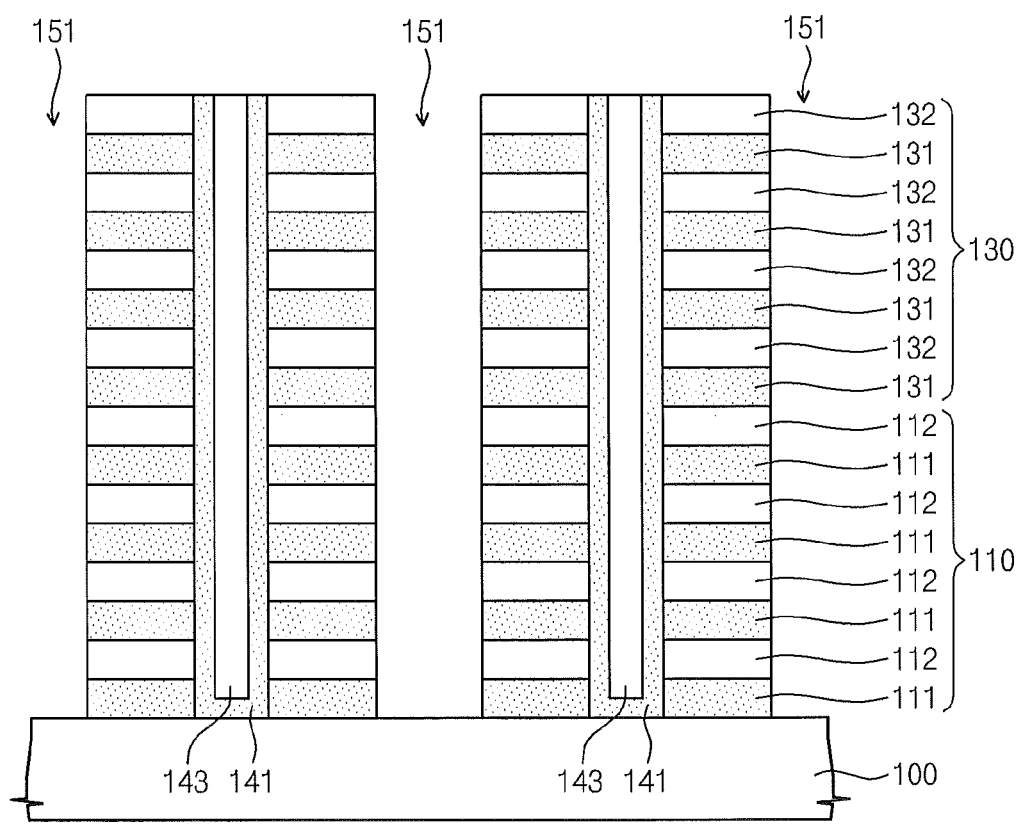

Referring to FIG. 8, a plurality of grooves 151 may be formed in the first and second stack structures 110 and 130. Each of the grooves 151 may penetrate the first and second stack structures 110 and 130. Each of the grooves 151 may be formed to have a line shape extending in a first direction. Each of the grooves 151 may expose a portion of the top surface of the substrate 100.

Figure 9:
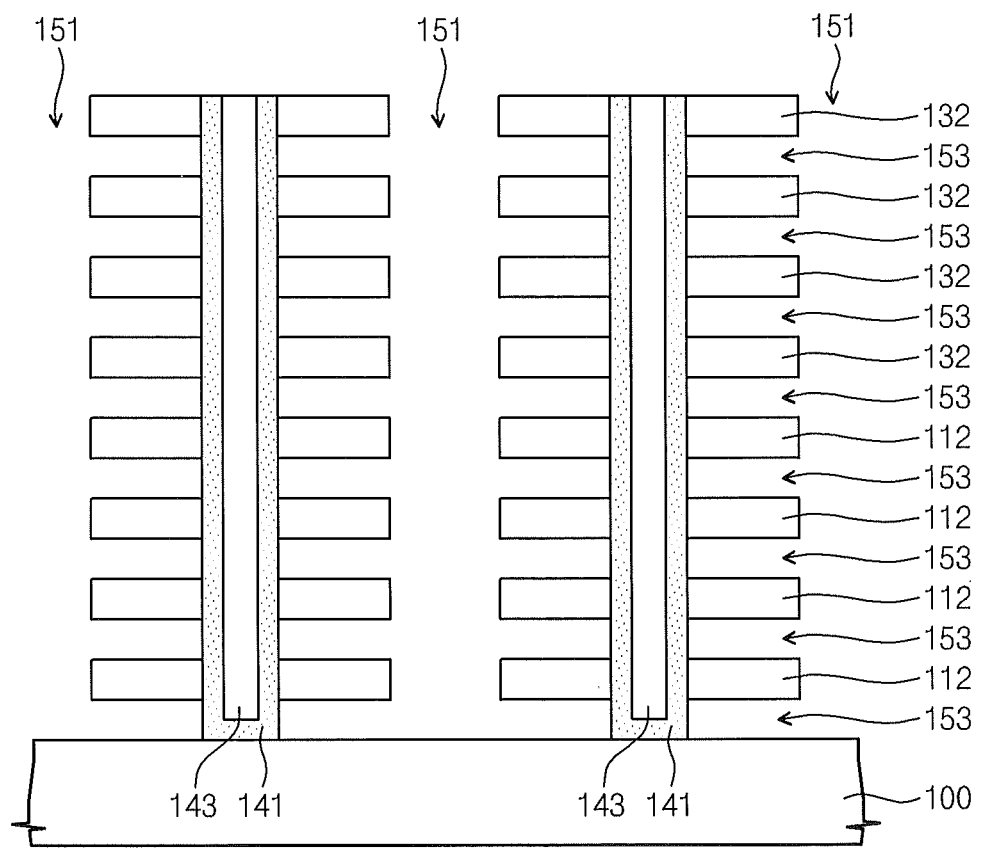
Figure 10:
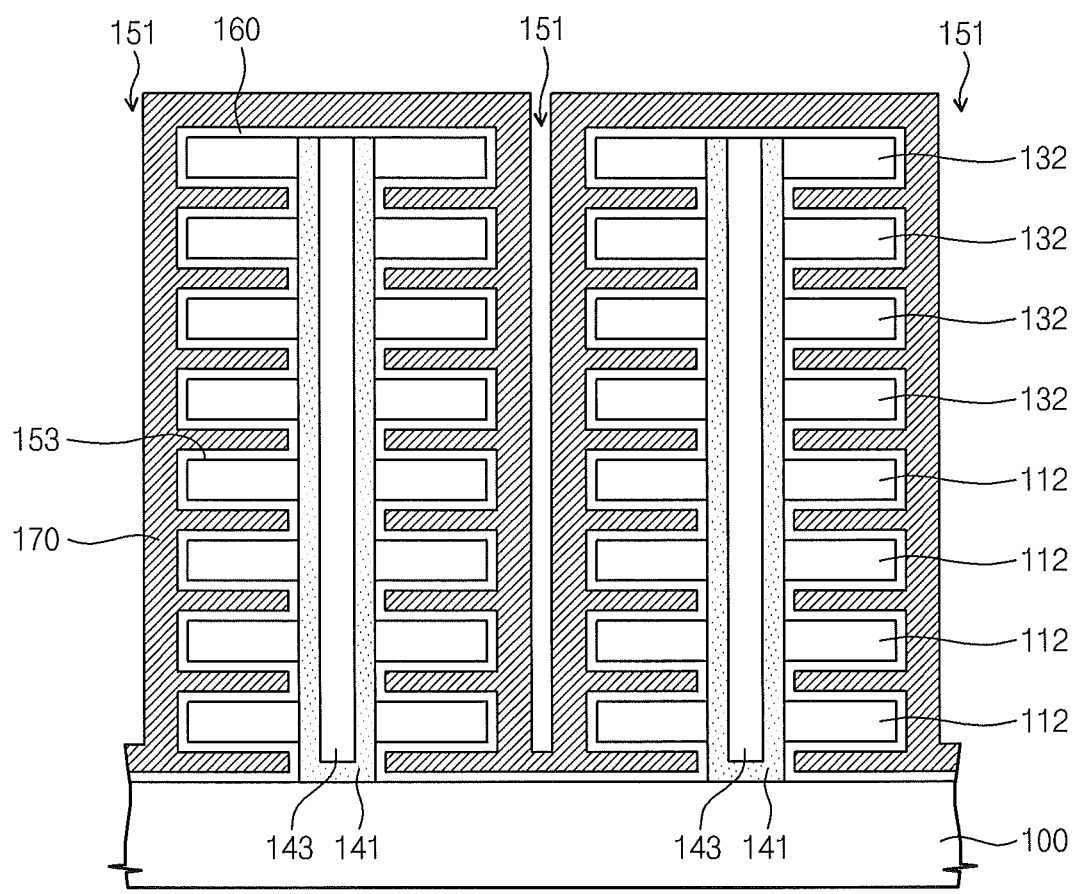

Referring to FIG. 9, the first and second material layers 111 and 131 exposed by the grooves 151 may be removed to form empty regions 153 between the first and second dielectric layers 112 and 132. The empty regions 153 may horizontally extend from the grooves 151 to expose portions of sidewalls of the active patterns 141. Referring to FIG. 10, a data storage layer 160 may be conformably formed on the substrate including the empty regions 153. The data storage layer 160 may be formed using a chemical vapor deposition (CVD) process or an atomic layer deposition (ALD) process. In an embodiment, the data storage layer 160 may include a composite of a tunneling dielectric layer, a charge storage layer and a blocking dielectric layer. The charge storage layer may include a dielectric layer having deep level traps which are capable of storing electric charges. For example, the charge storage layer may include a nitride layer and/or an insulating metal oxide layer (e.g., an aluminum oxide layer and/or a hafnium oxide layer). The tunneling dielectric layer may include a thermal oxide layer. The tunneling dielectric layer may be formed of a single layered material or a multi layered material. For example, the tunneling dielectric layer may be formed of a silicon oxide layer, a silicon nitride layer and/or a silicon oxynitride layer. The blocking dielectric layer may be formed of a single layered material or a multi layered material. For example, the blocking dielectric layer may include at least one of a silicon oxide layer and a high-k dielectric layer. The high-k dielectric layer corresponds to a dielectric layer having a dielectric constant which is higher than that of the tunnel dielectric layer. For example, the high-k dielectric layer may include an insulating metal oxide layer such as an aluminum oxide layer or a hafnium oxide layer.

In another embodiment, the data storage layer 160 may include a composite of the data storage layer and the blocking dielectric layer. In this case, the tunnel dielectric layer may be formed on the sidewalls of the through openings prior to formation of the active patterns 141. That is, the tunnel dielectric layer may be conformably formed on the substrate including the through openings prior to formation of the active patterns 141. Thus, the tunnel dielectric layer may be formed between the active patterns 141 and the data storage layer 160. In still another embodiment, the data storage layer 160 may include only the blocking dielectric layer. In this case, the tunnel dielectric layer and the charge storage layer may be formed on the sidewalls of the through openings prior to formation of the active patterns 141. That is, the tunnel dielectric layer and the charge storage layer may be conformably formed on the substrate including the through openings prior to formation of the active patterns 141. Thus, the tunnel dielectric layer and the charge storage layer may be formed between the active patterns 141 and the data storage layer 160. A conductive layer 170 filling the empty regions 153 may be formed on the substrate including the data storage layer 160. That is, the conductive layer 170 may completely fill the empty regions 153 and partially fill the grooves 151. The conductive layer 170 may include at least one of a doped silicon layer, a tungsten layer, a conductive metal nitride layer and a metal-semiconductor compound layer.

Figure 11:
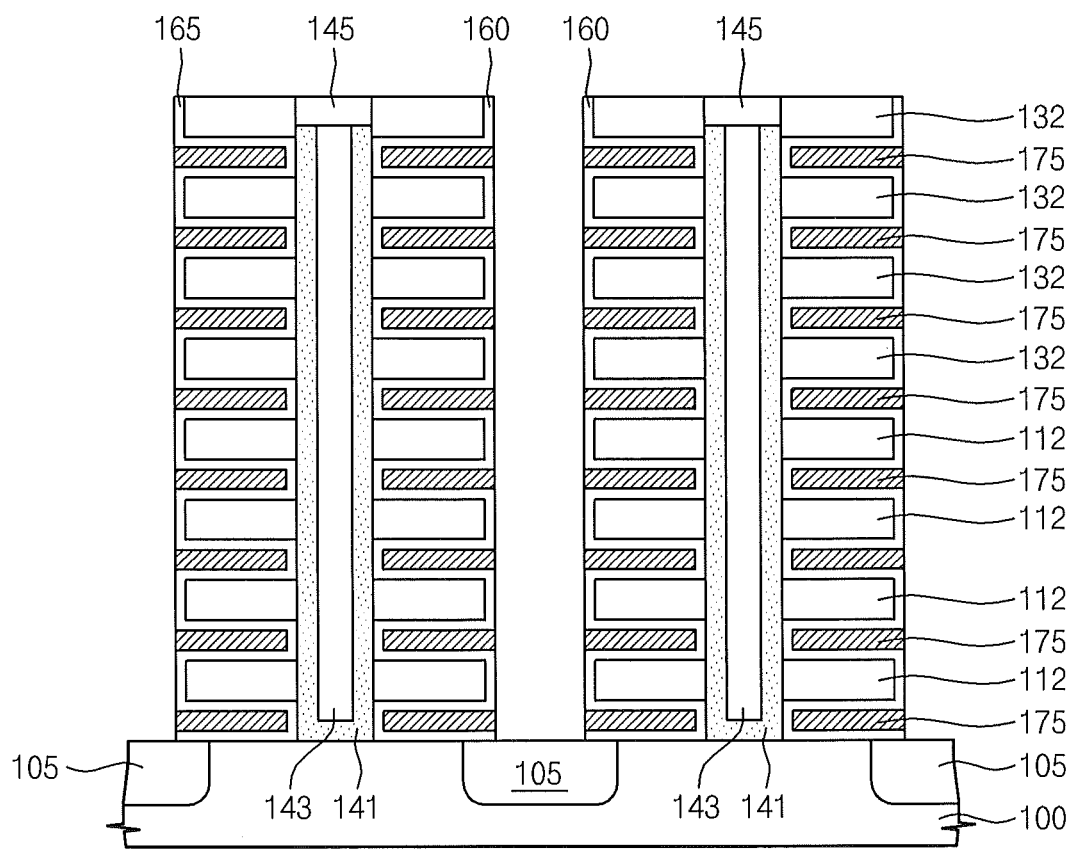

Referring to FIG. 11, the conductive layer 170 existing outside the empty regions 153 may be selectively removed to form gate patterns 175 remaining in the empty regions 153. The gate patterns 175, which are vertically adjacent to each other, may be separated from each other by the first or second dielectric layer 112 or 132. The gate patterns 175 may be laterally recessed from outer sidewalls of the first or second dielectric layer 112 or 132. The conductive layer 170 existing outside the empty regions 153 may be selectively removed using at least one of a planarization process, an isotropic etching process, and an anisotropic etching process, for example. In an embodiment, the uppermost and lowermost gate patterns 175 of the gate patterns 175 may be formed to be thicker than the others.

In an embodiment, each of the uppermost gate patterns 175 may constitute a string selection transistor, and each of the lowermost gate patterns 175 may constitute a ground selection transistor. Further, each of the gate patterns 175 between the uppermost and lowermost gate patterns 175 may constitute a nonvolatile memory cell transistor.

In an embodiment, the data storage layer 160 existing in lower portions of the grooves 151 may be removed to expose portions of the top surface of the substrate 100. Impurity doping regions 105 may be formed in the substrate 100 under the grooves 151. The impurity doping regions 105 may be formed by injecting dopants into the substrate 100 under the grooves 151 using an ion implantation process. The impurity doping regions 105 may act as common source lines (CSL). In an embodiment, although not shown in the drawings, metal-semiconductor compound regions may be additionally formed on the impurity doping regions 105, respectively. In this case, the impurity doping region 105 and the metal-semiconductor compound region on the impurity doping region 105 may constitute one of the common source lines. Drain regions 145 may also be formed in upper portions of the active patterns 141. The drain regions 145 may be formed by applying an ion implantation process to the upper portions of the active patterns 141.

Figure 12:
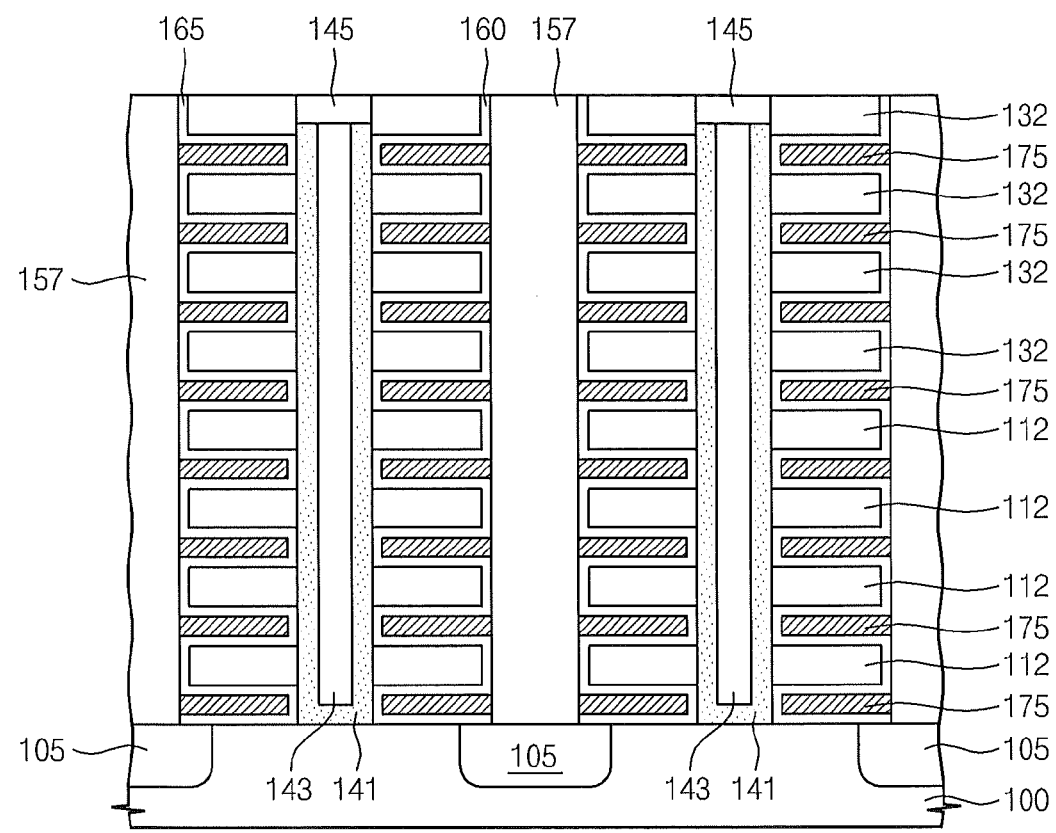

Referring to FIG. 12, isolation patterns 157 may be formed in the grooves 151, respectively. The isolation patterns 157 may include at least one of a silicon oxide material, a silicon nitride material and a silicon oxynitride material. In the event that the gate patterns 175 are laterally recessed from the outer sidewalls of the first or second dielectric layer 112 or 132, the isolation patterns 157 may completely fill the recessed regions beside the gate patterns 175. That is, each of the isolation patterns 157 may be formed to include protrusions that laterally extend from a main body thereof.

Figure 13A:
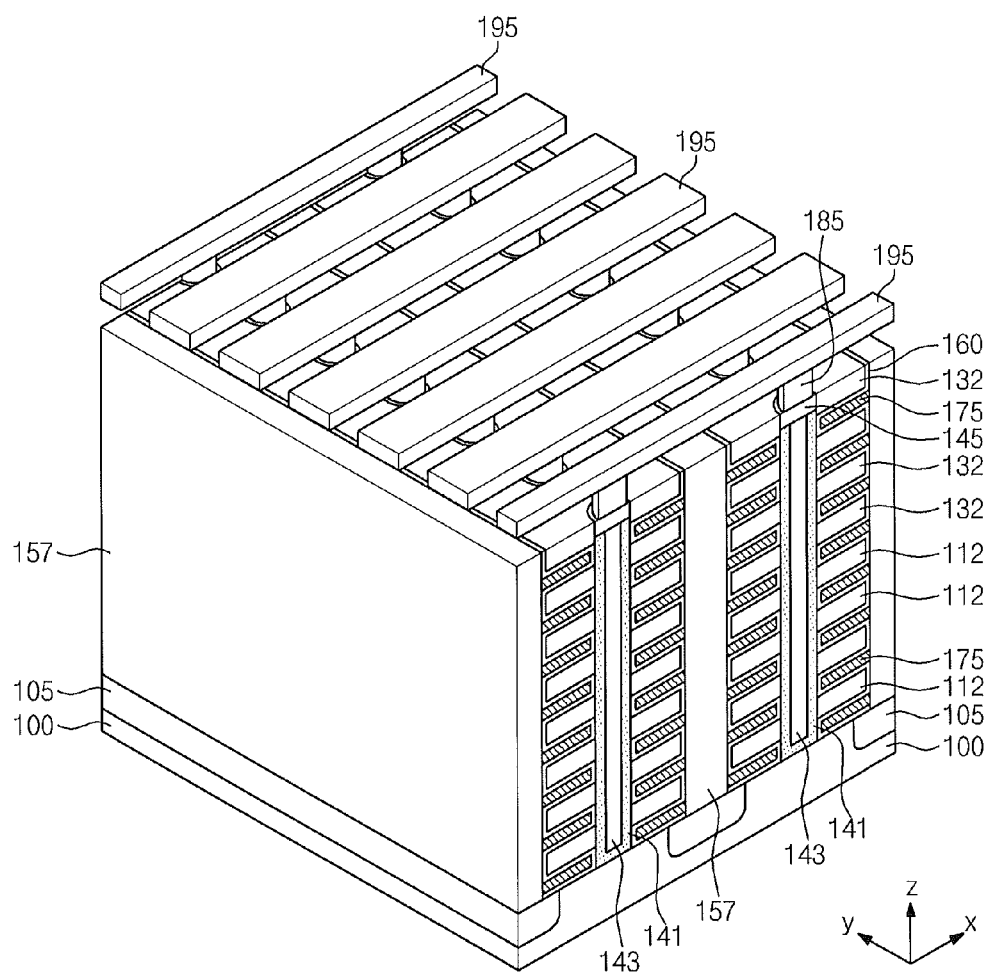
FIG. 13A is a perspective view illustrating a semiconductor memory device fabricated by a formation method according to an embodiment of the inventive concept.
Figure 13B:
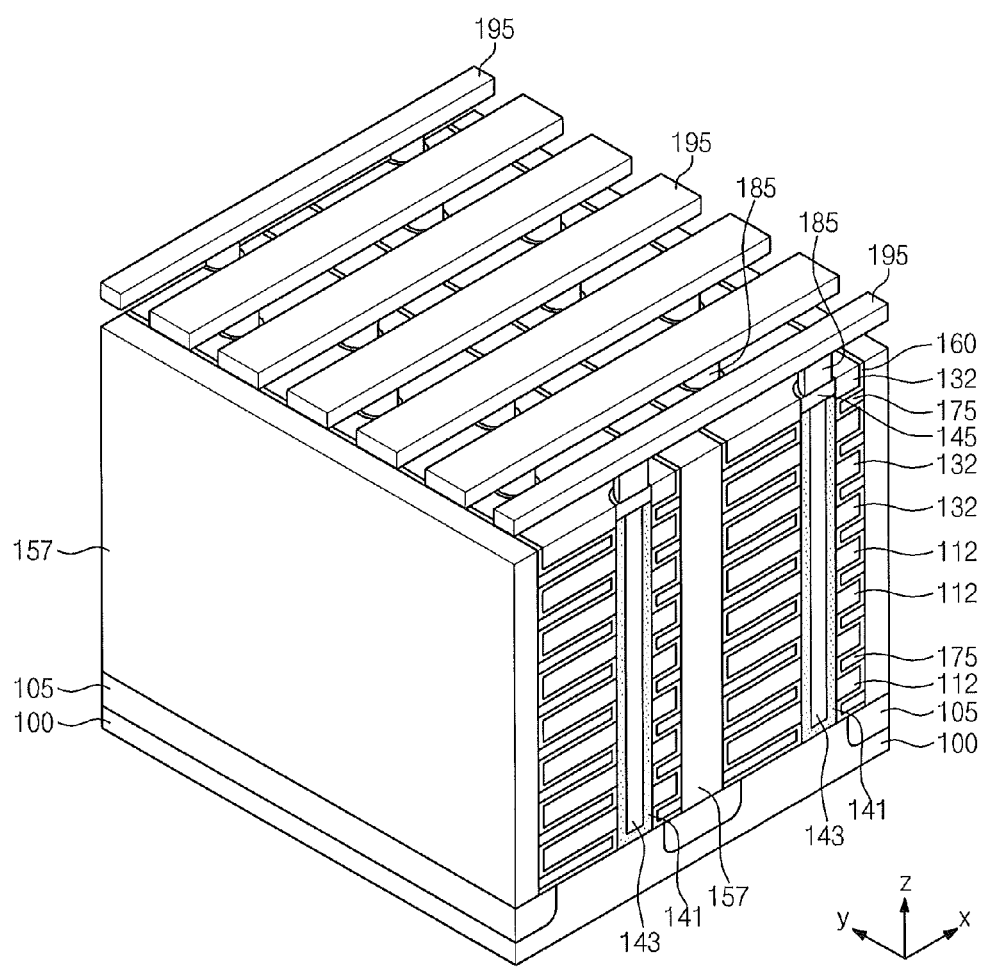
FIG. 13B is a perspective view illustrating a semiconductor memory device fabricated by a formation method according to a modified embodiment of the inventive concept.

FIGS. 13A and 13B are perspective views illustrating semiconductor memory devices fabricated by formation methods according to embodiments of the inventive concept. FIGS. 13A and 13B illustrate two different arrays of the active patterns 141 on the substrate 100, respectively. As illustrated in FIGS. 13A and 13B, contact plugs 185 may be formed on the active patterns 141, respectively. The contact plugs 185 may be electrically connected to the drain regions 145 formed in the upper regions of the active patterns 141, respectively. Interconnection lines 195 may be formed on the contact plugs 185. The interconnection lines 195 may be formed to extend in a second direction crossing the first direction. The first direction may correspond to a direction which is parallel with a Y-axis, and the second direction may correspond to a direction which is parallel with an X-axis.

Referring to FIGS. 13A and 13B, the plurality of active patterns 141 may be two dimensionally arrayed in rows and columns on the substrate 100 in a plan view. The plurality of active patterns 141 may be classified into a first group of active patterns 141 and a second group of active patterns 141, and one of the isolation patterns 157 may be disposed between the first group of active patterns 141 and the second group of active patterns 141 which are adjacent to each other. One of the interconnection lines 195 may be electrically connected to the active patterns 141 which are arrayed in one of the rows.

According to some embodiments of the invention, the active patterns 141 in each of the first and second groups of active patterns 141 may be arrayed in one of the columns which are parallel with the first direction, as illustrated in FIG. 13A. That is, the through openings filled with one group of the first and second groups of active patterns 141 may also be formed in the first and second stack structures 110 and 130 along one of the columns. In another embodiment of the invention, the active patterns 141 in each of the first and second groups of active patterns 141 may be arrayed in a pair of columns which are parallel with the first direction, as illustrated in FIG. 13B. The active patterns 141 in a first column of the pair of columns may not overlap with the active patterns 141 in a second column of the pair of columns in the first direction. In other words, the active patterns 141 in each group of active patterns 141 may be arranged in a zigzag pattern in the first direction. In this case, the through openings filled with one group of the first and second groups of active patterns 141 may also be formed in the first and second stack structures 110 and 130 to be arranged in a zigzag pattern along the pair of columns.

According to the present embodiment described above, through openings penetrating a plurality of layers may be formed using a plurality of separated patterning processes, and the through openings may be filled with active patterns 141 in a subsequent process. In the patterning processes, bulk sacrificial patterns 123 may be formed in first openings 115 penetrating a first stack structure 110, the bulk sacrificial patterns 123 may be formed of a highly polymerized compound material containing carbon. Thus, after formation of second openings 135 in a second stack structure 130 stacked on the first stack structure 110, the bulk sacrificial patterns 123 may be removed using a dry etching process that employs a reaction gas including oxygen as an etching gas. That is, the bulk sacrificial patterns 123 may be successfully removed with minimization of damage applied to the substrate 100, the first stack structure 110 and the second stack structure 130. Thus, a reliable semiconductor memory device may be realized. Further, according to the present embodiments, capping sacrificial patterns 127 may be formed to cover top surfaces of the bulk sacrificial patterns 123 in the first openings 115. The carbon in the bulk sacrificial patterns 123 may be vaporized and out-diffused during subsequent high temperature processes. The vaporization and the out-diffusion of the carbon may cause liftoff of certain material layers to be formed on the first stack structure 110. However, liftoff of the certain material layers may be suppressed because of the presence of the capping sacrificial patterns 127. Thus, a more reliable semiconductor memory device may be realized.

Figure 14:
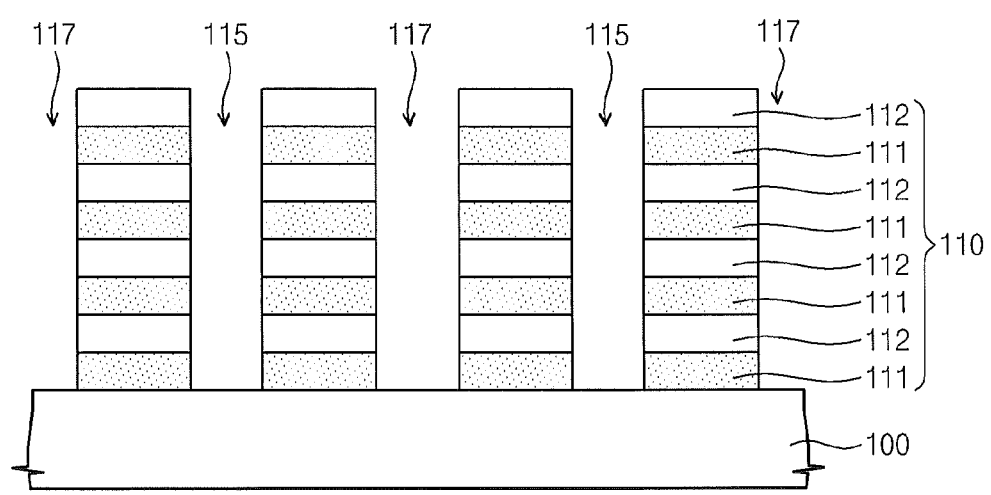
FIGS. 14 to 20 are cross sectional views illustrating a method of forming a semiconductor memory device according to another embodiment of the inventive concept.

FIGS. 14 to 20 are cross sectional views illustrating a method of forming a semiconductor memory device according to additional embodiments of the inventive concept. Referring to FIG. 14, a first stack structure 110 may be formed on a substrate 100. The first stack structure 110 may be formed by alternately and repeatedly stacking a plurality of first material layers 111 and a plurality of first dielectric layers 112 on the substrate 100. In an embodiment, the first material layers 111 may be formed of a material layer having an etch selectivity with respect to the first dielectric layers 112. The first stack structure 110 may be patterned to form first openings 115 and first grooves 117 that penetrate the first stack structure 110. The first openings 115 and the first grooves 117 may expose portions of a top surface of the substrate 100. The first openings 115 may be formed to be spaced apart from the first grooves 117. In an embodiment, the first grooves 117 may be formed to have a line shape extending in a first direction. According to some of these embodiments of the invention, the first openings 115 and the first grooves 117 may be formed using a single patterning process. Alternatively, the first openings 115 and the first grooves 117 may be formed using two (or more) patterning processes.

Figure 15:
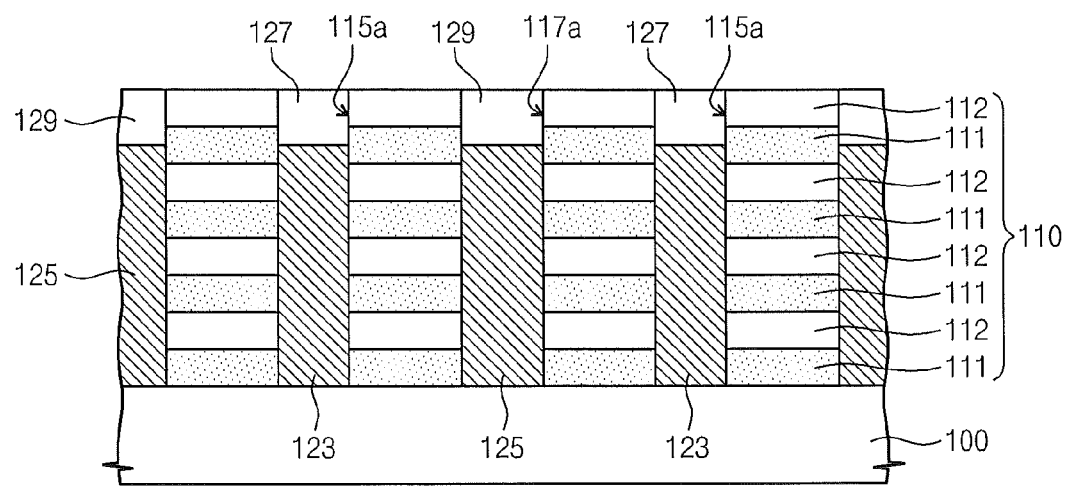

Referring to FIG. 15, a first bulk sacrificial pattern 123 and a first capping sacrificial pattern 127 may be formed in each of the first openings 115. Further, a second bulk sacrificial pattern 125 and a second capping sacrificial pattern 129 may be formed in each of the first grooves 117. In an embodiment, the first and second bulk sacrificial patterns 123 and 125 may be simultaneously formed. In more detail, the first and second bulk sacrificial patterns 123 and 125 may be formed by depositing a bulk sacrificial layer filling the first openings 115 and 117 on the first stack structure 110 and by etching a portion of the bulk sacrificial layer. The bulk sacrificial layer may be formed using the same processes described hereinabove. Thus, the bulk sacrificial layer may include a highly polymerized compound material containing carbon. In an embodiment, the bulk sacrificial layer may be formed using a spin coating process. For example, the bulk sacrificial layer may be formed as a spin-on-hard mask (SOH) layer. According to some of these embodiments, etching a portion of the bulk sacrificial layer may be performed as described hereinabove. Thus, etching a portion of the bulk sacrificial layer may be performed using an etch-back process until top surfaces of the first and second bulk sacrificial patterns 123 and 125 are recessed to a lower level than a top surface of the first stack structure 110 and first recessed regions 115a are thereby formed on the first bulk sacrificial patterns 123 and second recessed regions 117a are formed on the second bulk sacrificial patterns 125. Each of the first recessed regions 115a may be defined by a top surface of the first bulk sacrificial pattern 123 and a portion of a sidewall of the first opening 115. Similarly, each of the second recessed regions 117a may be defined by a top surface of the second bulk sacrificial pattern 125 and a portion of a sidewall of the first groove 117.

First capping sacrificial patterns 127 may be formed in the first recessed regions 115a on the first bulk sacrificial patterns 123, respectively. Second capping sacrificial patterns 129 may be formed in the second recessed regions 117a on the second bulk sacrificial patterns 125, respectively. Top surfaces of the first and second capping sacrificial patterns 127 and 129 may be coplanar with the top surface of the first stack structure 110. The first and second capping sacrificial patterns 127 and 129 may be formed by depositing a capping sacrificial layer, which fills the first and second recessed regions 115a and 117a on the first stack structure 110, and by etching the capping sacrificial layer until the top surface of the first stack structure 110 is exposed. The first and second capping sacrificial patterns 127 and 129 may include the same material as the capping sacrificial patterns 127 described in the previous embodiment.

Figure 16:
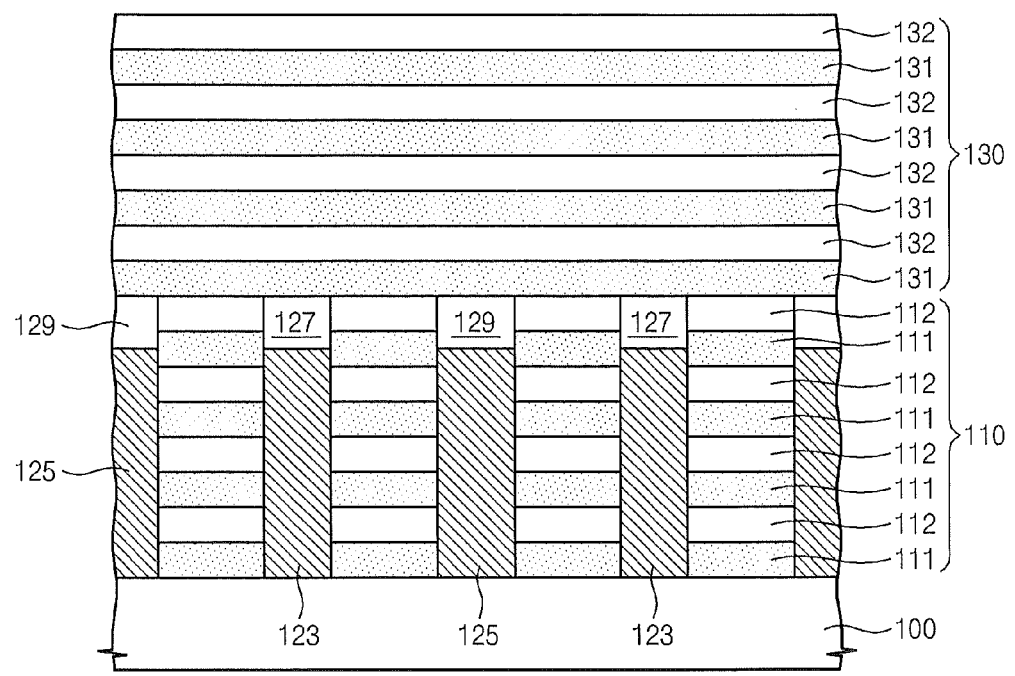

Referring to FIG. 16, a second stack structure 130 may be formed on the first stack structure 110 and the first and second capping sacrificial patterns 127 and 129. The second stack structure 130 may be formed by alternately and repeatedly stacking a plurality of second material layers 131 and a plurality of second dielectric layers 132. The second material layers 131 and the second dielectric layers 132 may be formed using the same processes described hereinabove with respect to previously-described embodiments of the inventive concept.

Figure 17:
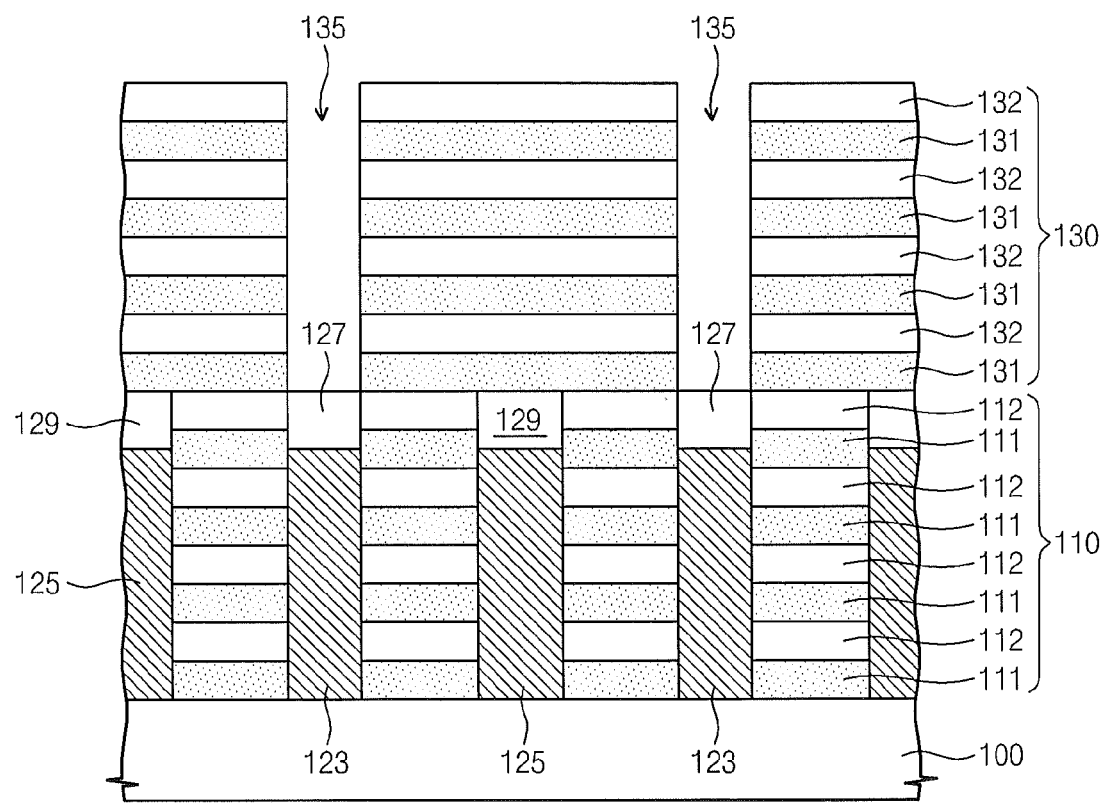

Referring to FIG. 17, the second stack structure 130 may be patterned to form second openings 135 penetrating the second stack structure 130. The second openings 135 may be formed to at least partially overlap with the first openings 115, respectively. That is, the second openings 135 may be formed over the first openings 115, respectively. In an embodiment, the second openings 135 may completely overlap with the first openings 115 in a plan view. The second openings 135 may expose top surfaces of the first capping sacrificial patterns 127, respectively. The second openings 135 may be formed using the same manner as described in the previous embodiment.

Figure 18:
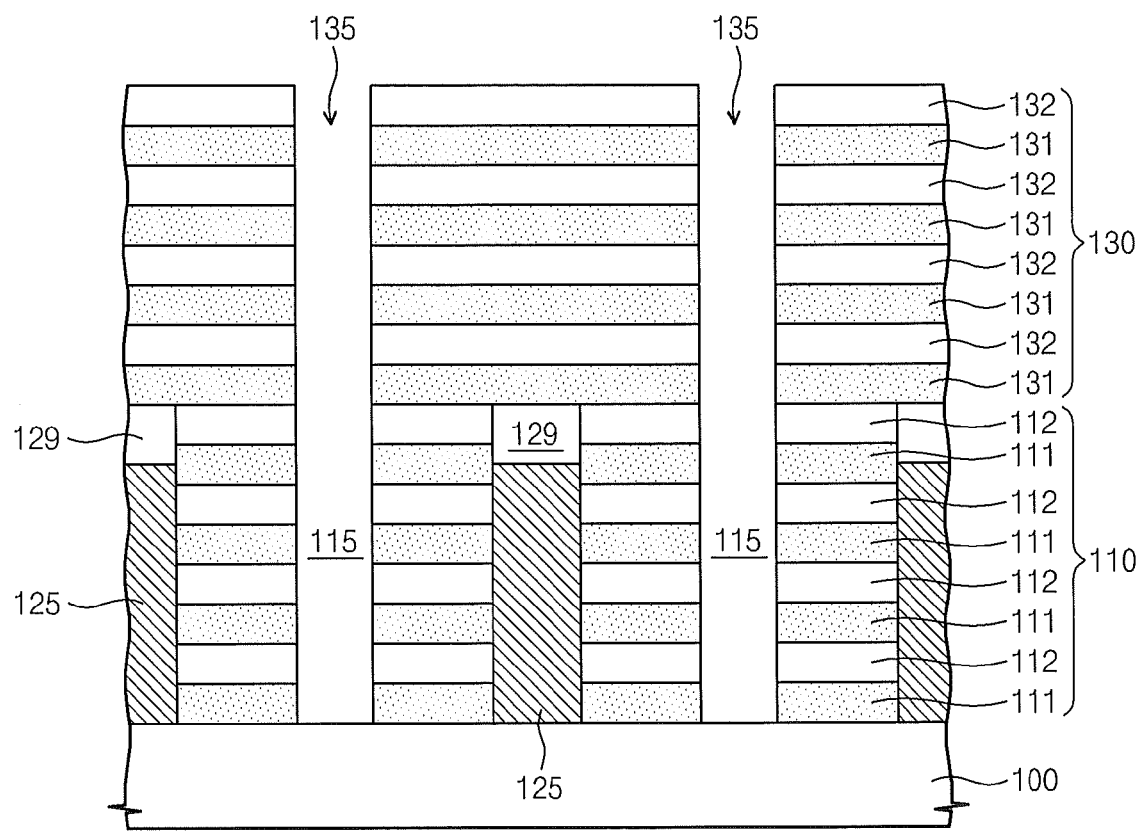

Referring to FIG. 18, the first capping sacrificial patterns 127 may be removed. The first capping sacrificial patterns 127 may be removed using the same manner as described with reference to FIG. 6. In an embodiment, the process for forming the second openings 135 and the process for removing the first capping sacrificial patterns 127 may be performed in a same reaction chamber. The first bulk sacrificial patterns 123 may be then removed. According to some embodiments of the invention, the first bulk sacrificial patterns 123 may be removed using a dry etching process. The dry etching process for removing the first bulk sacrificial patterns 123 may be performed using a reaction gas including oxygen since the first bulk sacrificial patterns 123 includes a highly polymerized compound material containing carbon. The first and second material layers 111 and 131, the first and second dielectric layers 112 and 132 and the substrate 100 may have a high etch resistant property in the reaction gas for removing the first bulk sacrificial patterns 123. That is, the first and second material layers 111 and 131, the first and second dielectric layers 112 and 132, and the substrate 100 may be etched only minimally during the dry etching process for removing the first bulk sacrificial patterns 123. Thus, while the first bulk sacrificial patterns 123 are removed using the dry etching process, damage applied to the first and second material layers 111 and 131, the first and second dielectric layers 112 and 132, and the substrate 100 may be minimized. The first capping sacrificial patterns 127 and the first bulk sacrificial patterns 123 are removed to empty the first openings 115 and the second openings 135. Consequently, the first openings 115 and the second openings 135 may be spatially connected to each other to define a plurality of through openings. Each of the through openings may penetrate the first and second stack structures 110 and 130.

Figure 19:
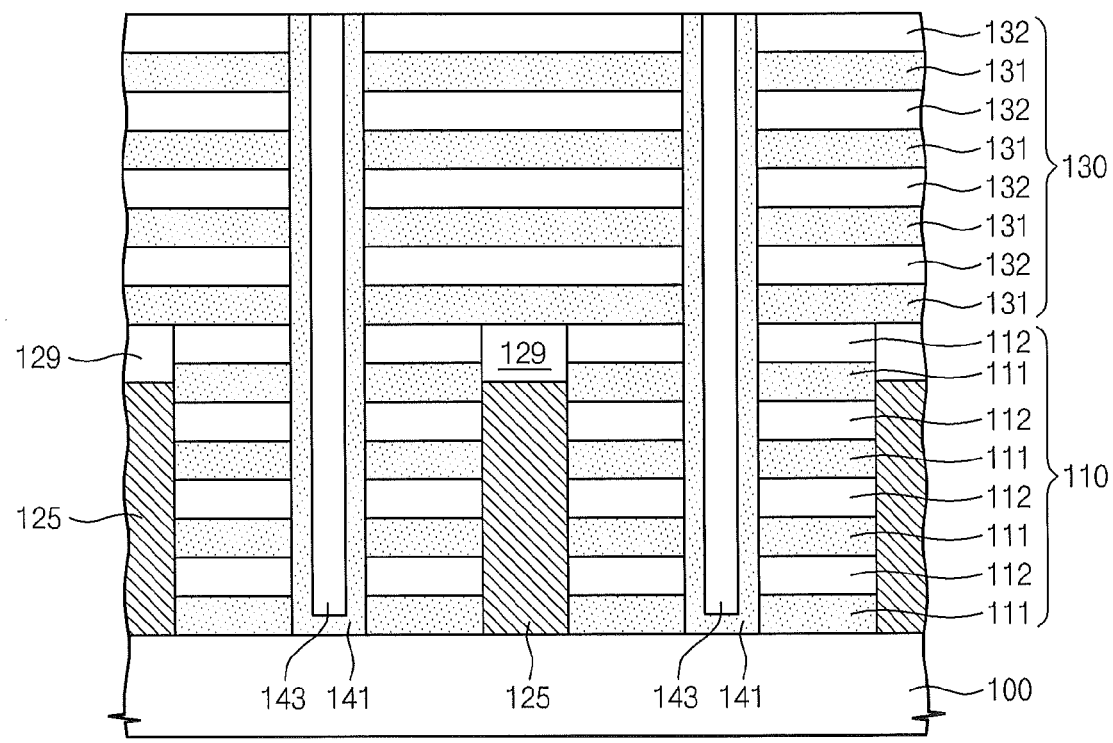
Figure 20:
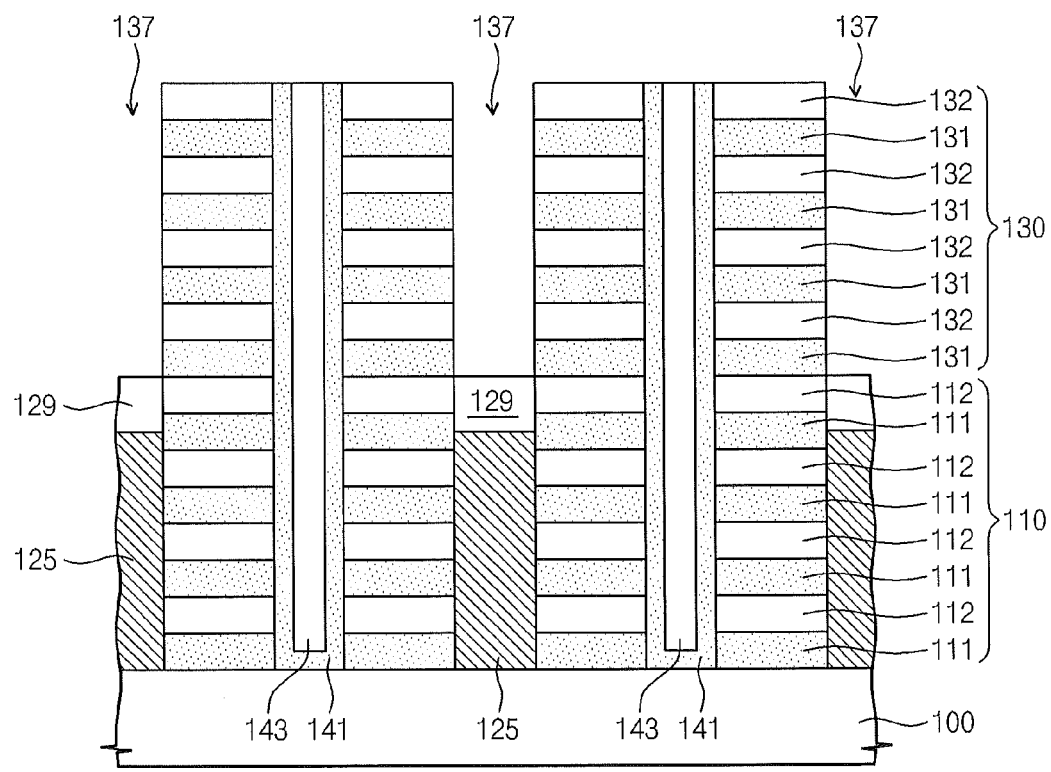

Referring to FIG. 19, an active pattern 141 and a buried dielectric pattern 143 may be formed in each through opening defined by the first opening 115 and the second opening 135. Referring to FIG. 20, second grooves 137 may be formed in the second stack structure 130. The second grooves 137 may be formed to penetrate the second stack structure 130. The second grooves 137 may be formed to have a line shape extending in the same direction as the first grooves 117. The second grooves 137 may at least partially overlap with the first grooves 117 in a plan view. That is, the second grooves 137 may be formed over the first grooves 117, respectively. Thus, the second grooves 137 may expose top surfaces of the second capping sacrificial patterns 129. In an embodiment, the second grooves 137 may completely overlap with the first grooves 117 in a plan view. Forming the second grooves 137 may include forming a mask pattern on the second stack structure 130 and etching the second stack structure 130 using the mask pattern as an etch mask. In an embodiment, etching the second stack structure 130 may be performed using a dry etching process.

Referring again to FIG. 8, the second capping sacrificial patterns 129 and the second bulk sacrificial patterns 125 are all removed. In an embodiment, the second capping sacrificial patterns 129 may be removed using an anisotropic dry etching process. During the dry etching process for removing the second capping sacrificial patterns 129, an etch rate of the second capping sacrificial patterns 129 may be higher than etch rates of the first and second material layers 111 and 131 and the first and second dielectric layers 112 and 132. The etching process for forming the second grooves 137 and the etching process for removing the second capping sacrificial patterns 129 may be performed in a same reaction chamber. That is, the etching process for forming the second grooves 137 and the etching process for removing the second capping sacrificial patterns 129 may be performed in a single reaction chamber. Consequently, top surfaces of the second bulk sacrificial patterns 125 may be exposed.

The second bulk sacrificial patterns 125 may then be removed using a dry etching process. The dry etching process for removing the second bulk sacrificial patterns 125 may be performed using a reaction gas including oxygen since the second bulk sacrificial patterns 125 includes a highly polymerized compound material containing carbon. The first and second material layers 111 and 131, the first and second dielectric layers 112 and 132, and the substrate 100 may have a high etch resistant property in the reaction gas for removing the second bulk sacrificial patterns 125. That is, the first and second material layers 111 and 131, the first and second dielectric layers 112 and 132, and the substrate 100 may be only minimally etched during the dry etching process for removing the second bulk sacrificial patterns 125. Thus, while the second bulk sacrificial patterns 125 are removed using the dry etching process, damage applied to the first and second material layers 111 and 131, the first and second dielectric layers 112 and 132, and the substrate 100 may be minimized. The present embodiments described above may exhibit the same benefits and advantages as the previous embodiments described with reference to FIGS. 1 to 12.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique. The package in which the semiconductor memory device according to one of the above embodiments is mounted may further include at least one semiconductor device (e.g., a controller and/or a logic device) that controls the semiconductor memory device.

Figure 21:
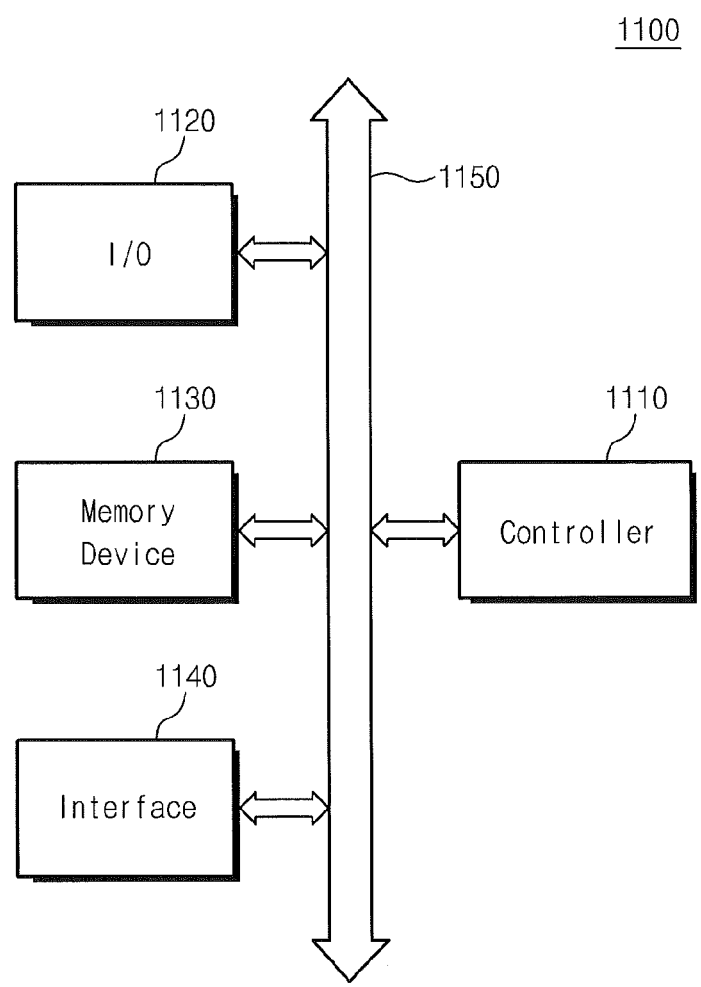
FIG. 21 is a schematic block diagram illustrating an example of memory systems including semiconductor memory devices according to embodiments of the inventive concept.

FIG. 21 is a schematic block diagram illustrating an example of electronic systems including semiconductor memory devices according to embodiments of the inventive concept. Referring to FIG. 21, an electronic system 1100 according to an embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one of the semiconductor memory devices according to the embodiments described above. The memory device 1130 may further include another type of semiconductor memory devices which are different from the semiconductor memory devices described above. For example, the memory device 1130 may further include a magnetic memory device, a phase change memory device, a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110. The electronic system 1100 may be applied to a personal digital assistant (PDA), a portable computer, a web tablet, a wireless phone, a mobile phone, a digital music player, a memory card or an electronic product. The electronic product may receive or transmit information data by wireless.

Figure 22:
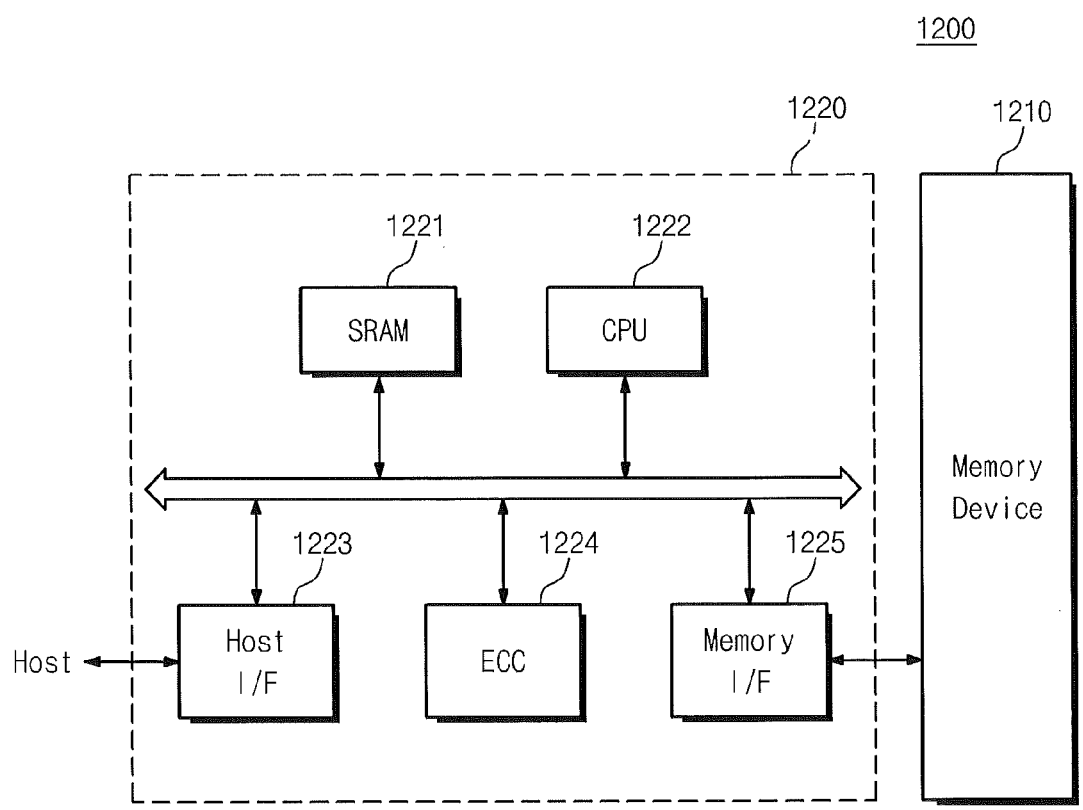
FIG. 22 is a schematic block diagram illustrating an example of memory cards including semiconductor memory devices according to embodiments of the inventive concept.

FIG. 22 is a schematic block diagram illustrating an example of memory cards including the semiconductor memory devices according to the embodiments of the inventive concept. Referring to FIG. 22, a memory card 1200 according to an embodiment of the inventive concept may include a memory device 1210. The memory device 1210 may include at least one of the semiconductor memory devices according to the various embodiments mentioned above. In other embodiments, the memory device 1210 may further include another type of semiconductor memory devices which are different from the semiconductor memory devices according to the embodiments described above. For example, the memory device 1210 may further include a nonvolatile memory device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

According to the embodiments set forth above, first openings are formed to penetrate a first stack structure including first dielectric layers and first material layers, and second openings are formed to penetrate a second stack structure including second dielectric layers and second material layers. The second stack structure is formed on the first stack structure, and the second openings are formed over the first openings, respectively. That is, the second openings are spatially connected to the first openings, respectively. Prior to formation of the second stack structure, a bulk sacrificial pattern and a capping sacrificial pattern sequentially stacked are formed in each of the first openings, and the bulk sacrificial patterns in the first openings are formed of a highly polymerized compound material including carbon. Thus, after formation of the second openings, the bulk sacrificial patterns can be easily removed using a reaction gas including oxygen with minimization of damage applied to the first and second stack structures.

In addition, even though a high temperature process is performed in a subsequent step(s), vaporization and/or out-diffusion of the carbon in the bulk sacrificial patterns may be suppressed because of the presence of the capping sacrificial patterns. Thus, it is possible to minimize process failures such as a lifting phenomenon of a certain material layer (e.g., the second stack structure) formed on the first stack structure. As such, highly reliable semiconductor memory devices may be realized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of forming a nonvolatile memory device, comprising:

forming a first vertical stack of layers on a substrate, said first vertical stack of layers comprising a composite of at least a plurality of first material layers and a plurality of second material layers arranged as an alternating stack of first and second material layers comprising different materials;

forming a first opening extending through at least a plurality of the first material layers and at least a plurality of the second material layers within the first vertical stack of layers;

filling at least a portion of the first opening with a composite stack of a bulk sacrificial pattern and a capping sacrificial pattern on the bulk sacrificial pattern, said bulk and capping sacrificial patterns comprising different materials and said bulk sacrificial pattern comprising a polymerized material containing carbon;

forming a second vertical stack of layers of different materials on the first vertical stack of layers;

forming a second opening that extends through the second vertical stack of layers and exposes the capping sacrificial pattern within the first opening; and removing the capping sacrificial pattern and the bulk sacrificial pattern through the second opening.

2. The method of claim 1, wherein the capping sacrificial pattern comprises a material that blocks diffusion of carbon therein.

3. The method of claim 1, wherein said forming a second opening and said removing the capping sacrificial pattern are performed within a single reaction chamber.

4. The method of claim 3, wherein said removing the bulk sacrificial pattern through the second opening comprises exposing the bulk sacrificial pattern to a reaction gas containing oxygen.

5. The method of claim 3, wherein said removing the bulk sacrificial pattern through the second opening comprises anisotropically dry etching the bulk sacrificial pattern using a reaction gas comprising oxygen.

6. The method of claim 1, wherein said forming a bulk sacrificial pattern in the first opening comprises depositing the bulk sacrificial pattern into the first opening using a spin-on coating process.

7. The method of claim 6, wherein depositing the bulk sacrificial pattern into the first opening using a spin-on coating process is followed by etching the deposited bulk sacrificial pattern for a sufficient duration to recess the bulk sacrificial pattern within the first opening; and wherein said forming a capping sacrificial pattern comprises depositing the capping sacrificial layer into a recess within the first opening.

8. The method of claim 7, wherein said forming a second vertical stack of layers is preceded by planarizing the capping sacrificial layer to thereby expose an upper surface of the first vertical stack of layers.

9. The method of claim 1, wherein said removing the capping sacrificial pattern and the bulk sacrificial pattern through the second opening is followed by lining sidewalls of the first and second openings with a semiconductor active pattern.

10. The method of claim 9, further comprising:
selectively etching the second vertical stack of layers and the first vertical stack of layers in sequence to define a groove therein that exposes the substrate; and then
replacing the plurality of second material layers with gate patterns of nonvolatile memory cell transistors.

11. A method of forming a semiconductor memory device, the method comprising:
forming a first stack structure including first dielectric layers and first material layers alternately and repeatedly stacked on a substrate;
forming a first opening penetrating the first stack structure;
forming a bulk sacrificial pattern and a capping sacrificial pattern sequentially stacked in the first opening, the bulk sacrificial pattern including a highly polymerized compound material containing carbon;
forming a second stack structure including second dielectric layers and second material layers alternately and repeatedly stacked on the first stack structure;
forming a second opening that penetrates the second stack structure to expose the capping sacrificial pattern; and
removing the capping sacrificial pattern and the bulk sacrificial pattern.

12. The method of claim 11, wherein the highly polymerized compound material containing carbon has an etch selectivity with respect to the first and second dielectric layers, the first and second material layers and the substrate.

13. The method of claim 11, wherein the capping sacrificial pattern is formed of a material having an etch selectivity with respect to the first and second dielectric layers, and the first and second material layers.

14. The method of claim 11, wherein forming the second opening comprises:
forming a mask pattern on the second stack structure; and
etching the second stack structure using the mask pattern as an etch mask,
wherein etching the second stack structure and removing the capping sacrificial pattern are performed in a same reaction chamber.

15. The method of claim 11, wherein forming the bulk sacrificial pattern comprises:
forming a bulk sacrificial layer filling the first opening on the first stack structure; and
etching a portion of the bulk sacrificial layer,
wherein etching the bulk sacrificial layer is performed until a top surface of the bulk sacrificial layer is located at a lower level than a top surface of the first stack structure.

16. The method of claim 15, wherein the bulk sacrificial layer is formed using a spin coating process.

17. The method of claim 16, wherein the bulk sacrificial layer is formed of a spin-on-hard mask layer.

18. The method of claim 15, wherein etching the bulk sacrificial layer is performed using a reaction gas including oxygen.

19. The method of claim 11, wherein forming the capping sacrificial pattern comprises:
forming a capping sacrificial layer on the first stack structure; and
planarizing the capping sacrificial layer until a top surface of the first stack structure is exposed.

20. The method of claim 11, wherein removing the bulk sacrificial pattern is performed using a dry etching process that employs a reaction gas including oxygen as an etching gas.

* * * * *